United States Patent
Pfeuffer et al.

(10) Patent No.: US 10,475,778 B2
(45) Date of Patent: Nov. 12, 2019

(54) OPTOELECTRONIC COMPONENT AND METHOD FOR PRODUCING AN OPTOELECTRONIC COMPONENT

(71) Applicant: OSRAM Opto Semiconductors GmbH, Regensburg (DE)

(72) Inventors: Alexander F. Pfeuffer, Regensburg (DE); Norwin von Malm, Nittendorf (DE); Stefan Grötsch, Bad Abbach (DE); Andreas Plößl, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/578,240

(22) PCT Filed: May 24, 2016

(86) PCT No.: PCT/EP2016/061709
§ 371 (c)(1),
(2) Date: Nov. 29, 2017

(87) PCT Pub. No.: WO2016/193071
PCT Pub. Date: Dec. 8, 2016

(65) Prior Publication Data
US 2018/0151548 A1 May 31, 2018

(30) Foreign Application Priority Data
May 29, 2015 (DE) .......... 10 2015 108 545

(51) Int. Cl.
*H01L 29/04* (2006.01)
*H01L 25/18* (2006.01)
(Continued)

(52) U.S. Cl.
CPC .............. *H01L 25/18* (2013.01); *H01L 25/50* (2013.01); *H01L 27/1214* (2013.01);
(Continued)

(58) Field of Classification Search
CPC .......................... H01L 25/50; H01L 27/1214
See application file for complete search history.

(56) References Cited

U.S. PATENT DOCUMENTS

| 7,964,890 B2 | 6/2011 | Plössl et al. |
| 9,076,944 B2 | 7/2015 | Neff et al. |
| (Continued) | | |

FOREIGN PATENT DOCUMENTS

| CN | 103778860 A | 5/2014 |
| DE | 102005047152 A1 | 4/2007 |
| (Continued) | | |

OTHER PUBLICATIONS

Day, J. et al., "III-Nitride Full-Scale High-Resolution Microdisplays," Applied Physics Letters 99, Jul. 22, 2011, 3 pages.

(Continued)

*Primary Examiner* — Samuel A Gebremariam
(74) *Attorney, Agent, or Firm* — Slater Matsil, LLP

(57) ABSTRACT

An optoelectronic component and a method for producing an optoelectronic component are disclosed. In an embodiment the optoelectronic component includes a semiconductor chip subdivided into a plurality of pixels, the pixels being arranged next to one another in a lateral direction and being configured to be activated individually and independently and a metallic connecting element having an upper side and an underside, the connecting element including a contiguous metallic connecting layer, which is completely passed through by a plurality of first metallic through-connections arranged next to one another in the lateral direction, wherein the first through-connections are electrically insulated and spaced from the connecting layer by insulating regions, wherein each first through-connection is unambiguously assigned to one pixel, is electrically-conductively connected to this pixel and forms a first electrical contact to this pixel, (Continued)

and wherein the semiconductor chip is connected by the connecting element to a carrier.

17 Claims, 11 Drawing Sheets

(51) Int. Cl.
*H01L 33/08* (2010.01)
*H01L 33/62* (2010.01)
*H01L 33/64* (2010.01)
*H01L 25/00* (2006.01)
*H01L 27/12* (2006.01)
*H01L 27/15* (2006.01)
*H01L 33/00* (2010.01)
*H01L 33/22* (2010.01)
*H01L 33/32* (2010.01)

(52) U.S. Cl.
CPC ........ *H01L 27/156* (2013.01); *H01L 33/0079* (2013.01); *H01L 33/08* (2013.01); *H01L 33/22* (2013.01); *H01L 33/62* (2013.01); *H01L 33/642* (2013.01); *H01L 33/647* (2013.01); *H01L 33/32* (2013.01); *H01L 2933/0066* (2013.01); *H01L 2933/0075* (2013.01)

(56) References Cited

U.S. PATENT DOCUMENTS

| | | |
|---|---|---|
| 9,473,714 B2 | 10/2016 | Aoki et al. |
| 9,551,479 B2 | 1/2017 | Groetsch et al. |
| 9,660,163 B2 | 5/2017 | Yang et al. |
| 9,748,309 B2 | 8/2017 | von Malm |
| 2006/0234482 A1 | 10/2006 | Ploessl et al. |
| 2007/0096130 A1 | 5/2007 | Schiaffino et al. |
| 2010/0207157 A1 | 8/2010 | Schiaffino et al. |
| 2012/0097972 A1 | 4/2012 | Sugizaki et al. |
| 2013/0207154 A1* | 8/2013 | Hoppel ................ H01L 25/167 257/99 |
| 2014/0111559 A1 | 4/2014 | Yang et al. |
| 2015/0129905 A1 | 5/2015 | Nam et al. |
| 2016/0027765 A1 | 1/2016 | von Malm et al. |

FOREIGN PATENT DOCUMENTS

| | | |
|---|---|---|
| DE | 102012110775 A1 | 5/2014 |
| DE | 102013102667 A1 | 10/2014 |
| DE | 102015105666 A1 | 10/2016 |
| EP | 2445006 A2 | 4/2012 |
| JP | 2000174059 A | 6/2000 |
| JP | 2005079298 A | 3/2005 |
| JP | 2008311273 A | 12/2008 |
| JP | 2012019217 A | 1/2012 |
| JP | 2012519954 A | 8/2012 |
| JP | 2015501085 A | 1/2015 |
| TW | 201007976 A | 2/2010 |
| TW | 201216699 A | 4/2012 |
| TW | I419359 B | 12/2013 |
| TW | M500993 U | 5/2015 |
| WO | 2010136326 A1 | 12/2010 |
| WO | WO-2013092304 A1 * | 6/2013 .......... H01L 27/156 |
| WO | 2014019795 A1 | 2/2014 |
| WO | 2014105403 A1 | 7/2014 |

OTHER PUBLICATIONS

Liu, Z.J. et al., "360 PPI Flip-Chip Mounted Active Matrix Addressable Light Emitting Diode on Silicon (LEDoS) Micro-Displays," Journal of Display Technology, vol. 9, No. 8, Aug. 2013, 5 pages.

Rae, B.R. et al., "CMOS Driven Micro-Pixel LEDs Integrated with Single Photon Avalanche Diodes for Time Resolved Fluorescence Measurements," Journal of Applied Physics, vol. 41, Apr. 4, 2008, 6 pages.

Tokuda, T. et al., "CMOS On-Chip Bio-Imaging Sensor with Integrated Micro Light Source Array for Optogenetics," Electronics Letters, vol. 48, No. 6, Mar. 15, 2012, 2 pages.

Zhang, S. et al., "CMOS-Controlled Color-Tunable Smart Display," IEEE Photonics Journal, vol. 4, No. 5, Oct. 2012, 8 pages.

* cited by examiner

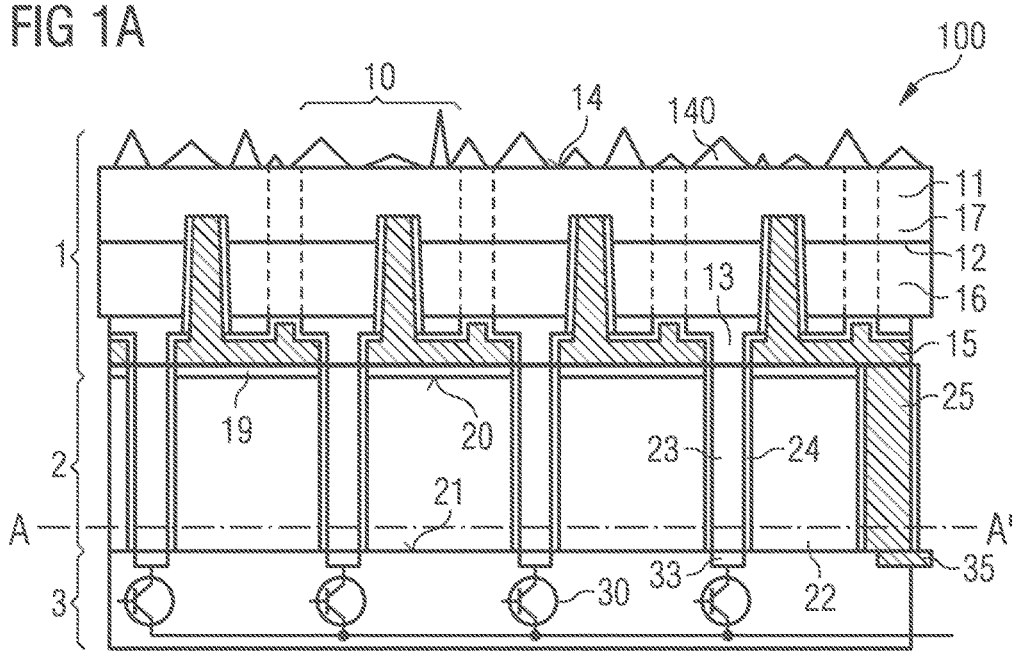
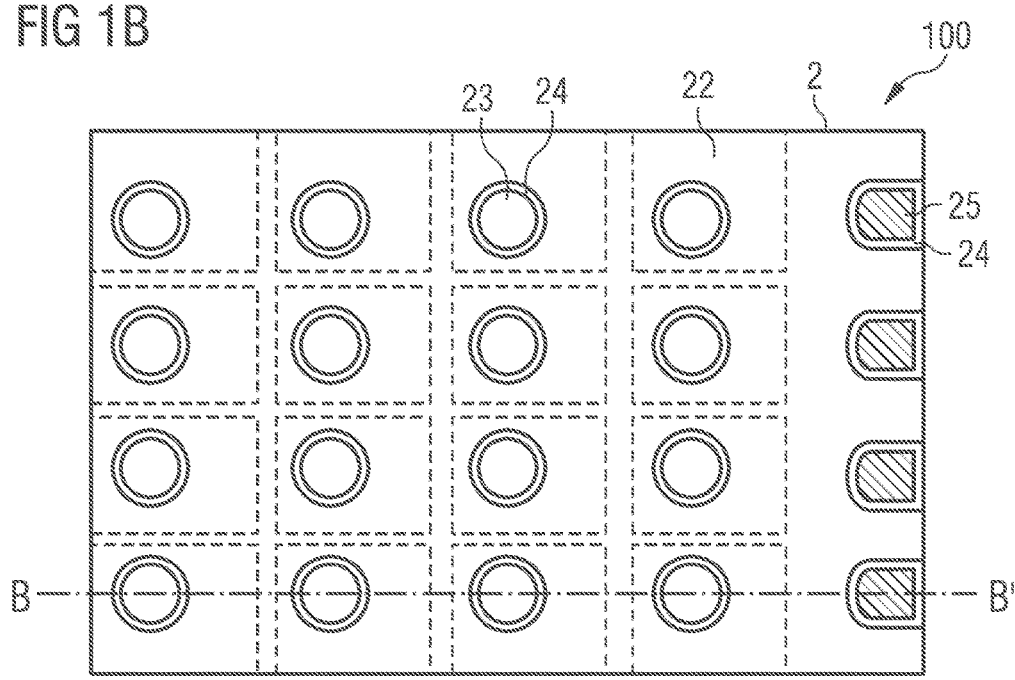

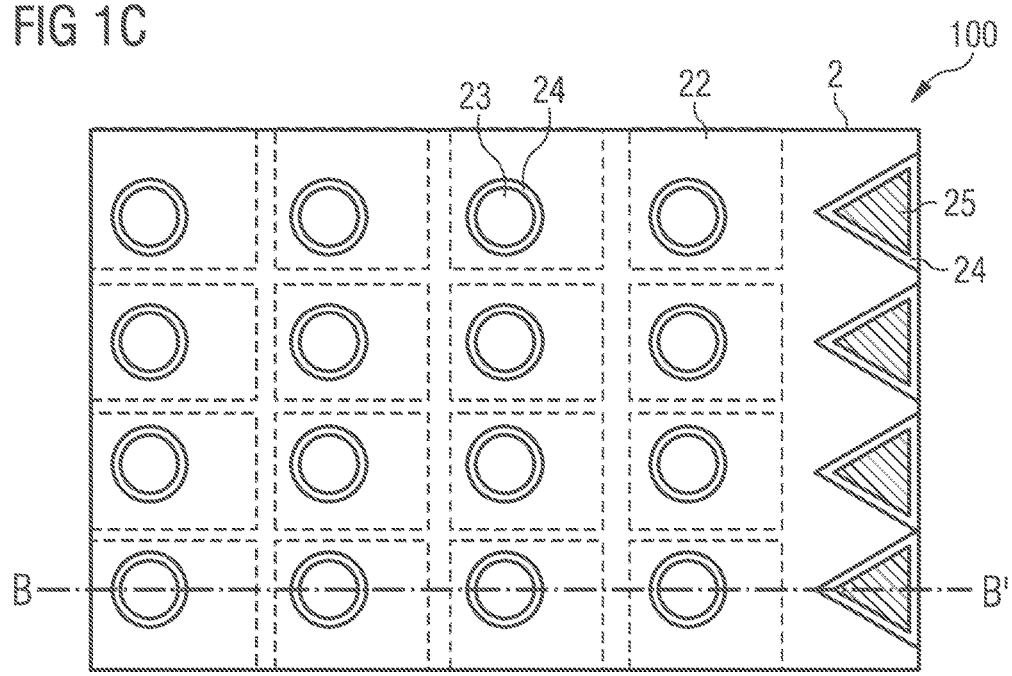
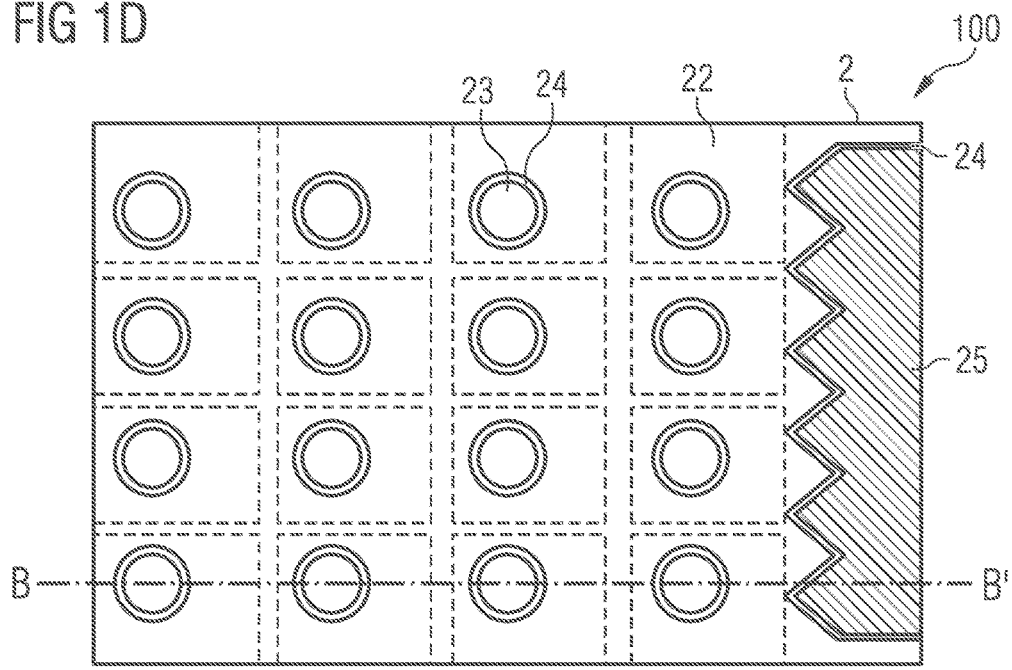

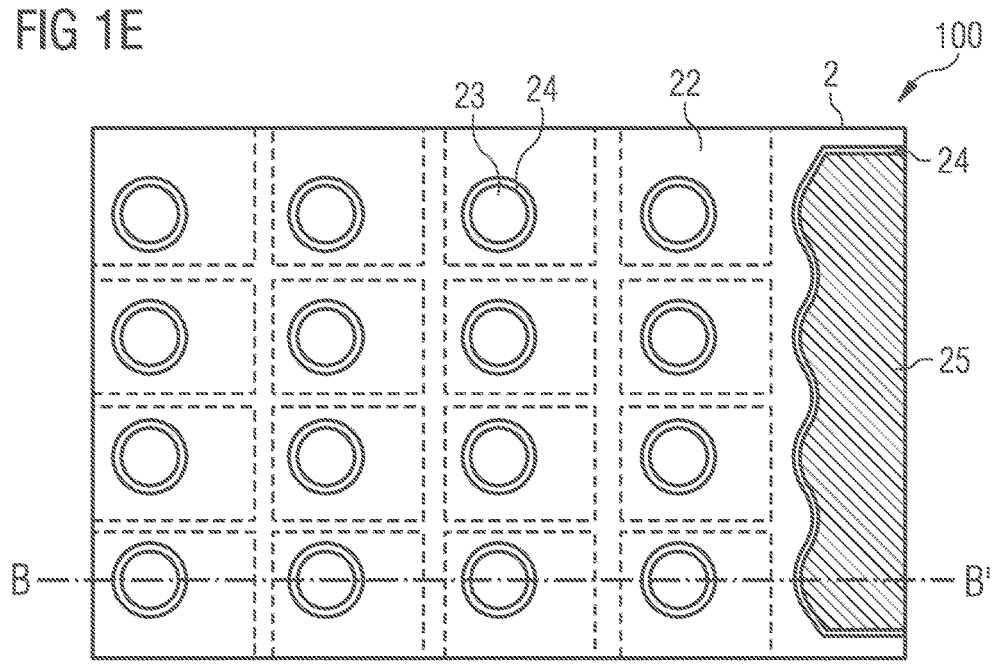

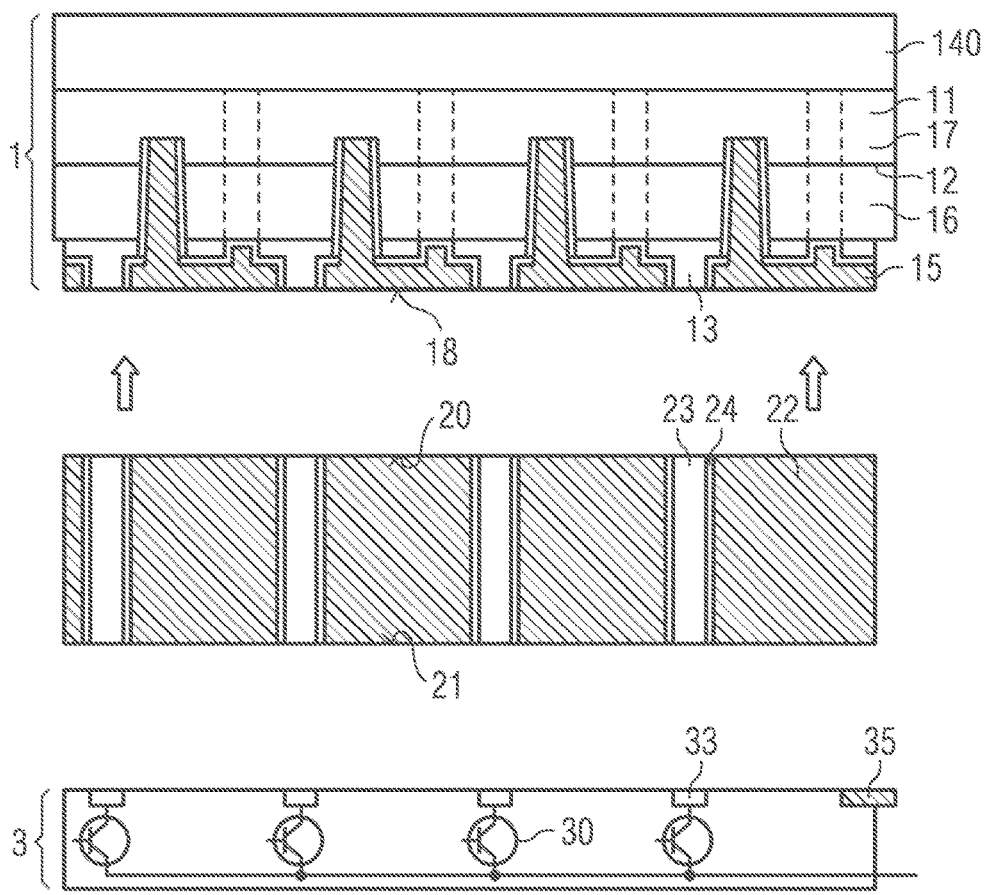

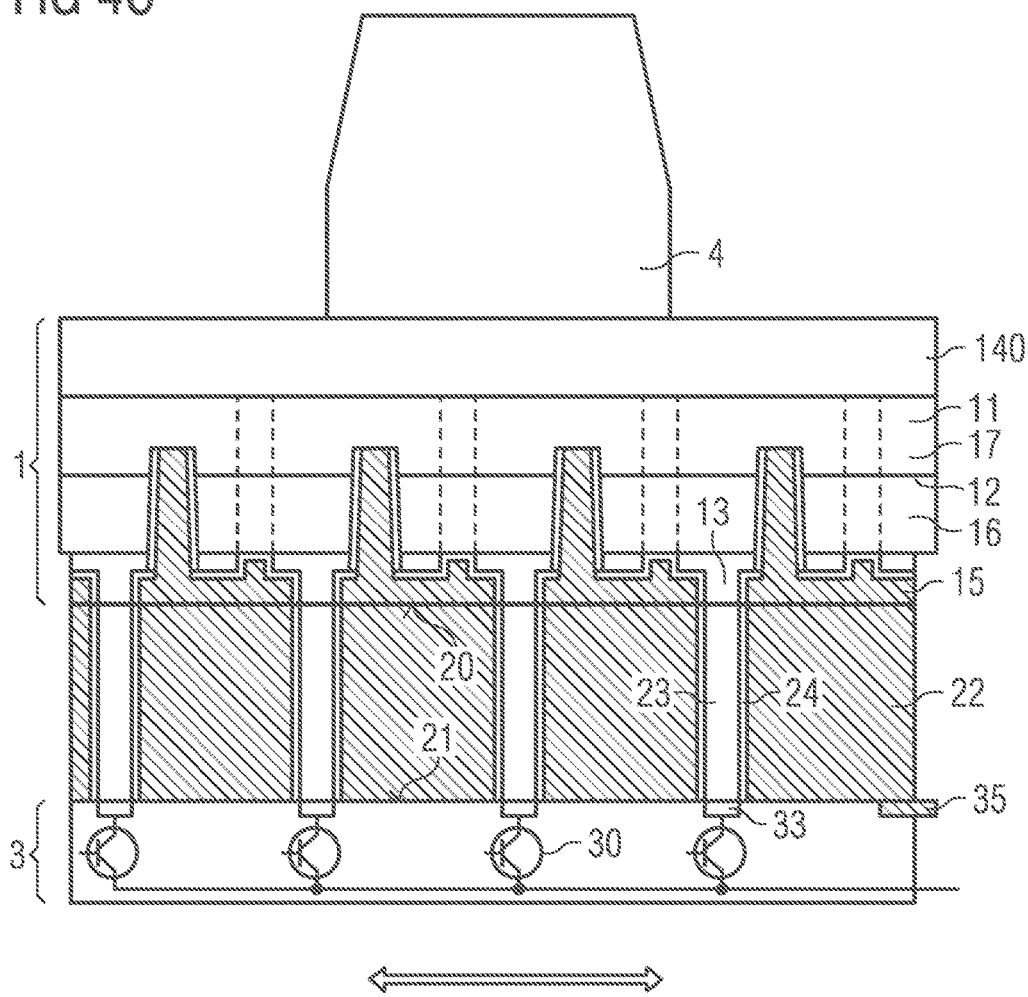

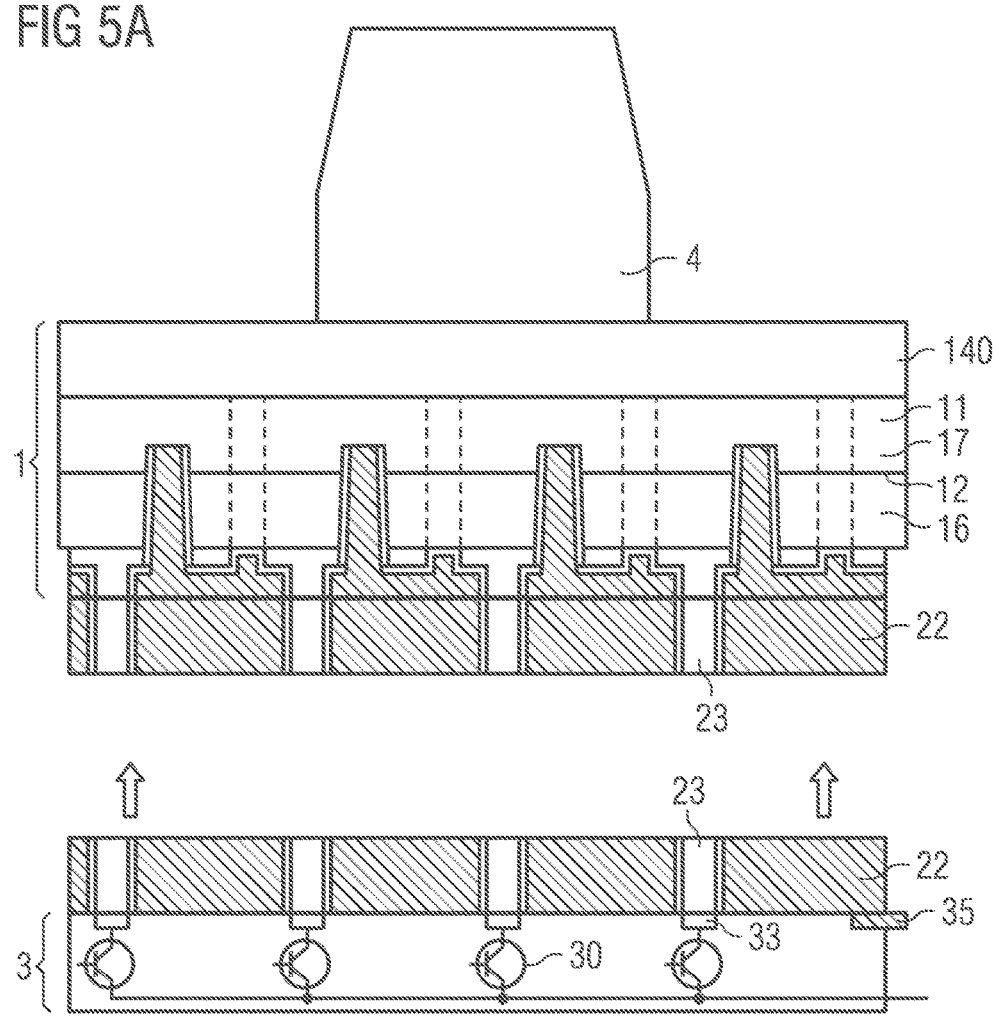

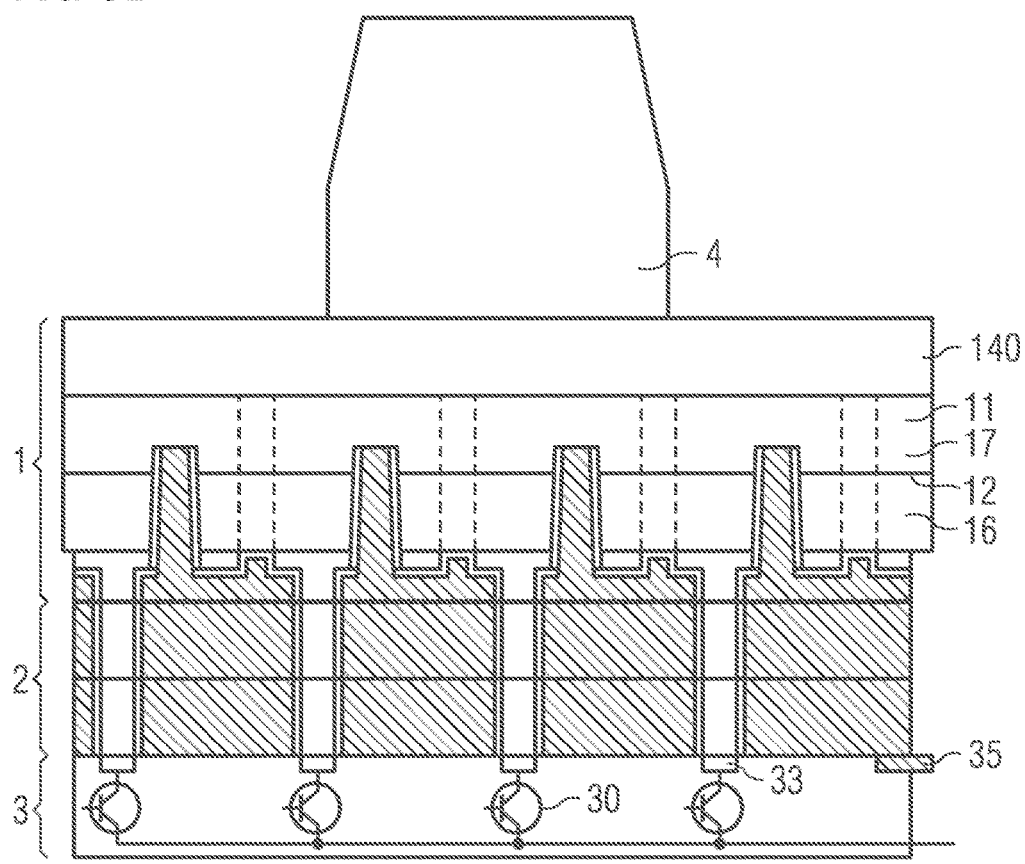

OPTOELECTRONIC COMPONENT AND METHOD FOR PRODUCING AN OPTOELECTRONIC COMPONENT

This patent application is a national phase filing under section 371 of PCT/EP2016/061709, filed May 24, 2016, which claims the priority of German patent application 10 2015 108 545.3, filed May 29, 2015, each of which is incorporated herein by reference in its entirety.

TECHNICAL FIELD

An optoelectronic component is provided. Furthermore, a method for producing an optoelectronic component is provided.

SUMMARY OF THE INVENTION

Embodiments provide an optoelectronic component with a particularly simple geometry of the electric connections. Further embodiments provide a method for producing such a component.

According to at least one embodiment, the optoelectronic semiconductor chip includes a semiconductor chip, which is sub-divided into a multitude of pixels that are arranged next to one another in the lateral direction and that can be activated individually and independently. Therefore, the semiconductor chip can particularly be a pixelated and/or segmented semiconductor chip. During operation, radiation can be emitted via a radiation exit surface of the semiconductor chip that, e.g., forms a main side of the semiconductor chip extending parallel to the lateral direction of the semiconductor chip, wherein each pixel forms a part of the radiation exit surface. The radiation exit surface forms a display, for example. The semiconductor chip may include at least 50 or 100 or 200 or 1,000 of such pixels, for example. The lateral dimensions of a pixel parallel to the radiation exit surface are between 30 µm and 300 µm inclusive, for example. The radiation exit surface of the semiconductor chip has a surface area of between 1 mm² and 50 mm² inclusive, for example. However, it is also possible for the semiconductor chip to form a high-resolution display, e.g., for Full HD applications. In this case, the pixels may have lateral dimensions of between 2 µm and 5 µm inclusive, for example.

The term semiconductor chip in particular relates to a functional semiconductor plate with integrated electronic contacts and/or circuits. Preferably, a semiconductor chip is a distinct module that can be handled separately, which can be plugged of soldered or bonded on to a carrier and is electrically-contacted in this way.

According to at least one embodiment, the optoelectronic semiconductor chip comprises a metallic connecting element with an upper side and an underside. The upper side and the underside form, e.g., opposite main surfaces of the connecting element, which essentially extend parallel to one another.

According to at least one embodiment, in a support region, the semiconductor chip is in direct contact with the upper side of the connecting element and is connected to the connecting element in a mechanically-stable manner through this support region. It is preferable here that a mounting side of the semiconductor chip opposite the radiation exit surface is in direct contact with the upper side of the connecting element.

In this case, the support region is the region, in particular exclusively the region, in which solid material of the semiconductor chip is in direct contact with solid material of the connecting element. Preferably, "solid material" is non-gaseous material. The semiconductor chip can be mechanically-supported by the supporting element by the resting on the support region. In this case, the connecting element can be self-supporting or requires the semiconductor chip or another carrier for mechanical stability.

According to at least one embodiment, the connecting element includes a contiguous, metallic connecting layer completely passed through by a multitude of first metallic through-connections arranged next to one another in the lateral direction. Therefore, the first through-connections at least extend form the underside to the upper side. The first through-connections can be metallic pins or electrically-conductive pins inserted through the connecting layer.

As used herein, the term "metallic" can mean that the respective metallic element consists of metal by at least 90 mass percent or 99 mass percent.

The connecting layer is formed contiguously, but not simply-connected, i.e., has hole-like apertures. The first through-connections are laterally and completely enclosed by the connecting layer in a top view of the upper side. Each aperture only has one first through-connection arranged therein, for example.

According to at least one embodiment, the connecting layer terminates flush with the upper side and the underside in the direction perpendicular to the lateral direction. This particularly means that the connecting layer forms part of the upper side and the underside. It is also possible for the connecting layer and the first through-connections to terminate flush with one another on the upper side and/or the underside.

According to at least one embodiment, the first through-connections are electrically insulated and spaced from the connecting layer by means of insulating regions. The insulating regions prevent the occurrence of a direct mechanical or electrical contact between the first through-connections and the connecting layer.

According to at least one embodiment, each of the first through-connections is clearly or bijectivity assigned to one pixel of the semiconductor chip and connected to this pixel in an electrically-conductive manner. In particular, each first through-connection forms a first electric contact to the assigned pixel. In other words, the respective pixel can be electrically contacted via the assigned first through-connection.

According to at least one embodiment, the semiconductor chip is directly connected to a carrier, which is located at the underside of the connecting element, in a mechanically-stable and electrically-conductive manner by means of the connecting element. The connecting element or the connecting layer and the carrier are in direct mechanical and possibly electrical contact on the underside. In other words, no further metallic layers or insulating layers are arranged between connecting element or between connecting layer and carrier.

In at least one embodiment, the optoelectronic semiconductor component comprises a semiconductor chip which is sub-divided into a multitude of pixels that are arranged next to one another in the lateral direction and that can be activated individually and independently. The optoelectronic semiconductor component also comprises a metallic connecting element having an underside and an upper side, the semiconductor chip being in direct contact with the upper side of the connecting element in a support region and connected thereto in a mechanically-stable manner. The connecting element comprises a contiguous, metallic connecting layer, which is completely passed-through by a multitude of first metallic through-connections arranged next to one another in the lateral direction. The connecting layer terminates flush with the upper side and the underside in the direction perpendicular to the lateral direction. The first through-connections are electrically insulated and spaced from the connecting layer by means of insulating regions. Each first through-connection is unambiguously assigned to one pixel, electrically-conductively connected to this pixel and forms a first electric contact to this pixel. In addition, the semiconductor chip is connected to a carrier, which is located directly on the underside of the connecting element, in a mechanically-stable and electrically-conductive manner.

Numerous electrical connections may be produced between the semiconductor chip and a carrier contacting this semiconductor chip. In embodiments of the invention described herein, a connecting element for electrically contacting a carrier and a semiconductor chip is provided. This element establishes the electrical contacts altogether and, at the same time, hermetically encapsulating the electric contacts. The metallic connecting layer may serve as an electric shield for the internal through-connections.

The connecting element is advantageously formed from a metal and rests on the semiconductor chip over a large area. In this way, the connecting element can also serve as a cooling element in order to effectively dissipate the heat generated by the semiconductor chip during operation, for example, via the carrier. The connecting element can also have a supporting and stabilizing effect for the semiconductor chip, allowing a detachment of a growth substrate in the semiconductor chip. Without the growth substrate, very good bright-dark contrasts can be realized between neighboring pixels.

According to at least one embodiment, the carrier is an active matrix element. The active matrix element can be based on Si or Ge or GaN or GaAs, for example. The carrier is preferably self-supporting here and forms the stabilizing element for the optoelectronic component, for example.

Furthermore, the active matrix element comprises a multitude of switches. Each switch can be a transistor, e.g., a thin film transistor, in particular a field effect transistor, for example. The active matrix element can be a metal oxide semiconductor component, known as CMOS component.

Each switch can be clearly or bijectively assigned to one pixel via a first through-connection and be connected to this pixel in an electrically-conductive manner. It is then possible to individually and independently activate the pixels via the switches, i.e., to contact them and supply them with electric power.

According to at least one embodiment, the surface area of the support region is at least 7/12 or 3/4 or 5/6 of the surface area of the mounting surface of the semiconductor chip facing the upper side. The mounting side extends over the entire lateral extension of the semiconductor chip, for example. The semiconductor chip is then mechanically supported or carried by the connecting element through such a surface portion. Such a large-area support area, in which solid material of the connecting element is in direct contact with solid material of the connecting element, particularly ensures an effective heat dissipation of the heat generated in the semiconductor chip.

According to at least one embodiment, the first trough-connections are in direct mechanical and electric contact with first contact elements of the semiconductor chip and/or in direct electric and mechanical contact with first contact elements of the active matrix material. In particular, the first contact elements of the semiconductor chip and the first contact elements of the active matrix element are elements which are different from the first through-connections of the connecting elements and elements produced independently and/or separate from these through-connections. In other words, the first trough-connections and the first contact elements of the semiconductor chips and/or of the active matrix element can consist of different materials. On the completed component, this can be proved in that the first trough-connections in the direction perpendicular to the lateral direction are not formed integrally with the first contact elements of the semiconductor chips and/or of the active matrix element.

According to at least one embodiment, the first through-connections and/or the connecting layer are not formed integrally in the direction perpendicular to the lateral direction. In particular, the connecting layer and/or the first through-connections comprise or consist of a multilayer structure of multiple, superimposed, different, individual metallic layers. It is possible, in this case, that a mixing of materials takes place in two individual layers adjoining one another, at least in the peripheral regions thereof. In this way, a Sn from an individual layer can be mixed with Au, Ni, Pt, In or Ti from an adjoining individual layer, for example. In this case, Sn and In are no longer present as pure elements, at least in the peripheral region, but are bound in an intermetallic bond with other elements.

According to at least one embodiment, the first through-connections and/or the connecting layer comprise or consist of one or more of the following alloys and/or one or more of the following layer structures: $Au_xSn_y$, $Cr/Ni_xSn_yTi_zAu_w$, $Ti/Pt_ySn_zIn_x$, $Ti/Pt_xSn_yTi_zAu_w$. The letters x, y, w and z indicate parameters for mixing ratios in the alloys. The individual layers separated by a "/" are preferably stacked on top of one another in direct contact to one another in the specified order. Particularly preferably, the connecting layer and/or the first trough-connections are solder elements comprising fused and subsequently cured regions due to a soldering process. The melting point of the connecting layer and/or of the first trough-connections is at least 45° C., for example.

According to at least one embodiment, the first through-connections and/or the connecting layer have at least two individual layers arranged one above the other in the vertical direction, between which an interface is formed. The at least two individual layers are connected to one another at the interface, for example, by means of a wafer bonding process. There can be found an increased defect density on the interface compared to the other regions of the first trough-connection or of the first connecting layer, compared to the other regions of the first through-connection, for example. The individual layers are connected to one another on the interface by means of covalent and/or metal bonds, for example. Here, the interface preferably extends essentially parallel to the upper side or underside of the connecting element.

The individual layers can comprise or consist of a material such as gold, copper, silver or nickel or tin or indium or bismuth, for example. The interface may have wave-like irregularities after the wafer-bonding process. In particular, sub-regions of the individual layers can extend beyond the course of the interface, prior to the wafer-bonding, and into a region of the adjoining individual layer.

According to at least one embodiment, the first through-connections and/or the connecting layer are porous, having a porous content of at least 10 vol-% or 20 vol-% or 30 vol-%. Here, the term pores in particular relates to bubbles filled with air and/or gas or inclusions inside the metal material of the first through-connections and/or of the connecting layer. Such a porous connecting layer or such first through-connections may refer to the production method or the connection technique of semiconductor chip and carrier. A metal sponge can be used as a basic material for the connecting layer and/or for the first through-connections, for example. During the compression process, for example, thermal compression, of the metal sponge, this sponge collapses and a solid connection to the carrier and/or the semiconductor chip is formed. After compression of the sponge, the collapsed metal material still has an increased percentage of pores.

According to at least one embodiment, the insulating regions are hollow spaces filled with gas. Each through-connection is completely surrounded by a gas in the lateral direction, e.g., by air. The gas effects the isolation between the connecting layer and the first through-connection. A solid or liquid insulating material is not arranged between the first through-connections and the connecting layer in this case.

As an alternative to the above embodiment, the insulation regions can also be formed by means of a solid or liquid insulating material, which is in direct mechanical contact to the first through-connections and the connecting layer then. This insulating material can be an organic polymer, such as Parylene or Omocer or Benzocyclobutene, BCB for short, or a plastic or an inorganic sol-gel material or a silicon oxide, such as $SiO_2$, or a silicon nitride, such as SiN.

According to at least one embodiment, the connecting element consists by at least 60 vol.-% or 75 vol.-% or 84 vol.-% of a metal. The remaining part of the connecting element can be formed by means of the insulating regions, for example. The connecting element preferably consists only of a metal and the, e.g., gas-filled, insulating regions.

According to at least one embodiment, the connecting layer is connected to the semiconductor chip or with each pixel in an electrically-conductive manner. The connecting layer can form a common counter-contact to the first contacts for all pixels, for example. During operation, electrons and holes can be injected into the semiconductor chip via the first contacts and the counter-contact. Since the first contacts can be activated individually and independently from one another, it is sufficient to have one common counter-contact for all pixels in order to still ensure an individual activation of all pixels.

For example, the connecting layer is electrically-conductively connected to one or multiple second contact elements of the semiconductor chip.

According to at least one embodiment, the connecting layer is electrically insulated from the semiconductor chip and does not form an electric contact to the semiconductor chip. The semiconductor chip may then comprise an insulating layer in the region of the connecting layer, this layer electrically insulating the connecting layer from the semiconductor chip. In a top view, the insulating layer covers the connecting layer, and the semiconductor chips are free of the insulating layer in regions of the first through-connections.

According to at least one embodiment, the connecting element comprises second metallic through-connections formed through the connecting layer and forming a counter-contact to the first contacts. All features that have been mentioned in conjunction with the first through-connections or that will be mentioned hereinafter can also be implemented for the second carrier and vice versa. The second through-connections can also be metal pins, for example, which are formed through the connecting layer and are completely enclosed by the connecting layer in a lateral view and are electrically-insulated from the connecting layer by means of insulating regions. However, the second through-connections can also be arranged on the edge of the component and not be completely enclosed laterally by the connecting layer. Preferably, the second through-connections are electrically-insulated from the first through-connections.

In particular, the second through-connections can be electrically connected or be electrically insulated from one another. In the first case, it is possible for the second through-connections to form a common counter-contact to the first contacts.

According to at least one embodiment, a second through-connection unambiguously or bijectively assigned to one pixel, electrically-conductively connected to this pixel and in each case forms a distinct counter-contact to the first contact of the pixel. Each contact can individually and independently be activated and is electrically-insulated from the remaining counter-contacts or the remaining second counter-contacts, respectively. In this case, the pixels can be activated individually and independently from one another not only via the first through-connections, but also via the second through-connections.

According to at least one embodiment, the first and second through-connections associated with one pixel are arranged in a common hole through the connecting layer. In particular, the connecting layer comprises a multitude of holes, with each hole having at least one first or exactly one first through-connection and at least one or exactly one second through-connection formed therethrough. The first and second though-connections arranged in a hole are preferably insulated from one another, but not separated from one another by the connecting layer.

According to at least one embodiment, the connecting element has a thickness of at least 0.5 µm or 5 µm or 10 µm. Alternatively, or in addition, the thickness of the connecting element is at most 50 µm or 40 µm or 30 µm. Here, the thickness is measured between the upper side and the underside.

According to at least one embodiment, the first through-connections have a lateral extension of at least 1 µm or 5 µm or 10 µm or 20 µm. Alternatively or in addition, the lateral extension of the first through-connections is at least 80 µm or 70 µm or 60 µm, respectively.

According to at least one embodiment, the distance between the connecting layer and the first through-connections is at least 0.5 µm or 2 µm or 5 µm or 10 µm. Alternatively or in addition, the distance is at most 50 µm or 40 µm or 30 µm. This distance corresponds to the thickness of the insulating regions.

According to at least one embodiment, the first through-connections have an ellipsoidal or circular or triangular or squared or V-shaped or rectangular cross-sectional area in a top view of the upper side. Generally, cross-sectional areas in the shape of regular or irregular polygons are conceivable. The corners of the polygons are preferably rounded-off and have curvature radii of at least 1 µm or 3 µm or 10 µm or 20 µm. Alternatively, or in addition, the curvature radii are at most 100 µm or 50 µm or 10 µm. The same may apply to the curvature radii of the insulating regions. The cross-sectional areas are particularly preferably formed round or elliptic, so that no edges or corners where voltage peaks could form are provided at all.

According to at least one embodiment, the semiconductor chip comprises a semiconductor layer sequence with an active layer provided to generate or absorb radiation during operation. The semiconductor layer sequence is based on a III-V semiconductor compound material, for example. The semiconductor material is preferably a nitride semiconductor compound material, such as $Al_nIn_{1-n-m}Ga_mP$, or also an arsenide semiconductor compound material, e.g., $Al_nIn_{1-n-m}Ga_mAs$, where $0 \leq n \leq 1$, $0 \leq m \leq 1$ and $m+n \leq 1$, respectively. In this case, the semiconductor layer sequence may comprise additional constituents. For reasons of simplicity, only the essential constituents of the crystal lattice of the semiconductor layer sequence, i.e., Al, As, Ga, In, N or P are indicated, even if these can in part be substituted or added with small amounts of other substances. Preferably, the semiconductor layer sequence is AlInGaN-based.

The active layer comprises at least one p-n-junction and/or a quantum well structure in the form of a single quantum well, SQW for short, or in the form of a multi quantum well structure, MQW for short, for example.

The active layer is configured, for example, to generate light in the ultraviolet range and/or in the blue spectral range and/or in the visible spectral range and/or infrared range during operation.

According to one embodiment, the semiconductor chip is free of a growth substrate for the semiconductor layer sequence. Free of a semiconductor layer sequence in particular means that a remainder of a growth substrate can still be arranged on the semiconductor layer sequence, but per se are not sufficient for the stabilization of the semiconductor chip. In particular, the remainders of the growth substrate can still form a decoupling structure on the radiation exit surface of the semiconductor chip.

According to one embodiment, the semiconductor chip is not mechanically self-supporting. In other words, the semiconductor chip would break or be deformed until being unusable. In the present case, the semiconductor element is stabilized and mechanically supported, for example, by the active matrix element and/or the connecting element. Further stabilizing components are not provided in the semiconductor element then. In particular, the semiconductor component is per se free of a stabilizing substrate.

According to at least one embodiment, the contact elements for electrical contacting of the semiconductor chip, in particular the first and second contact elements are arranged on the mounting side of the semiconductor chip. However, preferably, the active layer is interrupted by contact elements for electrical contacting, so that the active layer is contiguous, but not simply-connected.

According to at least one embodiment, the semiconductor layer sequence includes at least an n-conducting or a p-conducting semiconductor layer that extends contiguously along the entire lateral extension of the semiconductor chip. In other words, the semiconductor layer sequence can include an n-conducting and a p-conducting semiconductor layer, with the n-conducting semiconductor layer being contiguous and the p-conducting semiconductor layer being interrupted, for example.

The optoelectronic component can be applied, e.g., in vehicles, for example, in head lamp devices or interior illumination. Use of the component for lighting or illumination of traffic routes is conceivable as well.

Furthermore, a method for producing an optoelectronic component is provided. The method is particularly suitable for an optoelectronic component as described above. In other words, all features disclosed in conjunction with the optoelectronic component are also disclosed for the method and vice versa.

According to at least one embodiment, the method comprises a step A), in which a semiconductor chip is provided, which is sub-divided into a multitude of pixels that are arranged next to one another in the lateral direction and that can be activated individually and independently. Furthermore, a carrier is provided in a step B).

In a further method step C), a patterned metal layer is applied directly on to the semiconductor chip or directly on to the carrier. Alternatively, in each case one patterned metal layer can be applied directly on to the semiconductor chip or directly on to the carrier. The patterned metal layer includes a metallic connecting layer completely passed-through by a plurality of first metallic through-connections arranged next to one another in the lateral direction. The first through-connections are electrically insulated and spaced from one another by means of the connecting layer.

Applying the patterned metal layer on to the semiconductor chip and/or the carrier can be effected by means of a patterned mask and/or a metal-plating process.

The method further comprises a step D), in which the carrier and the semiconductor chip are mechanically and electrically connected via one or both patterned metal layers, in such a way, that a metallic connecting element is formed between the carrier and the semiconductor chip. In this case, the connecting element is formed from one or both metal layers.

After step D), each first through-connection is unambiguously or bijectively assigned to one pixel of the semiconductor chip, connected to this pixel in an electrically-conductive manner and forms a first electric contact to the respective pixel.

According to at least one embodiment, steps A) to D) are performed individually and independently from one another as separate steps, preferably in the specified order.

According to at least one embodiment, the patterned metal layer is provided in the form of a solder material in step C), via which the carrier is soldered on the semiconductor chip. In the direction perpendicular to the lateral direction, the solder material may comprise or consist of multiple, different, superimposed, individual metal layers. Prior to step D), the multilayered structure comprises one or more of the following layer structures, for example: Au/AuSn, Cr/Ni/Sn/Ti/Au, Ti/Pt/Sn/In, Ti/Pt/Sn/Ti/Au.

According to at least one embodiment, step D) comprises two individual steps D1) and D2), which are performed individually and independently from one another in the specified order, for example.

Preferably, first the semiconductor chip is temporarily attached on to the carrier in step D1). Temporarily attaching can be effected by means of a friction welding process or by means of a thermal compression process.

The semiconductor chip is then permanently attached to the carrier by means of a solder process. In the solder process, at least one of the metallic layers is fused within the patterned metal layer, thereby forming a permanent connection to the carrier and/or to the semiconductor chip.

According to at least one embodiment, step D1) is performed at a temperature which is below a melting temperature or solidus temperature of the solder material. In this way, it is prevented that a permanent connection between the semiconductor chip and the carrier is formed prior to the actual soldering process of step D2).

When fusing the solder material, an automatic self-centering and fine adjustment of the components attached one on to the other occurs. This can be traced back to a natural tendency of liquids to assume minimum areas. In this way, very precise adjusting precisions can be achieved with comparatively fast chip placement processes.

According to at least one embodiment, in step C), in each case one metal layer is applied on to both the carrier and the semiconductor chip.

According to at least one embodiment, the metal layers are chemo-mechanically planarized prior to step D), so that the surface roughness of the planarized surfaces is 100 nm or 50 nm or 20 nm at most, for example.

According to at least one embodiment, in step D), the planarized surfaces of the patterned metal layers are directly placed one on top the other and connected to one another by means of a wafer bonding process. Wafer bonding is generally known by the term optical contact bonding. After that, a relocation can be effected, for example, at mild temperatures of between 300 K and 500 K inclusive, which leads to the formation of metallic connections between the two patterned metal layers and to the formation of the connecting element.

According to at least one embodiment, the method comprises a step in which a growth substrate of the semiconductor chip is removed. The removal can be effected prior to or after step D). In the first case, the patterned metal layer is configured to be self-supporting and can support and mechanically stabilize the semiconductor chip freed from the growth substrate.

BRIEF DESCRIPTION OF THE DRAWINGS

Hereinbelow, an optoelectronic component and a method for producing an optoelectronic component are described with reference to the drawings by means of exemplary embodiments. Same reference numerals indicate same elements or components throughout the individual figures. However, no relations are made true to scale and individual elements can rather be illustrated in an exaggerated size for the purpose of a better understanding.

The figures show in:

FIGS. 1A to 1E, FIGS. 2A to 2B and FIGS. 3A to 3B show various exemplary embodiments of an optoelectronic component in a lateral cross-sectional view and in a top view; and FIGS. 4A to 4E and FIGS. 5A to 5B show various positions during the production process for exemplary embodiments of an optoelectronic component.

DETAILED DESCRIPTION OF ILLUSTRATIVE EMBODIMENTS

Figure 2A:
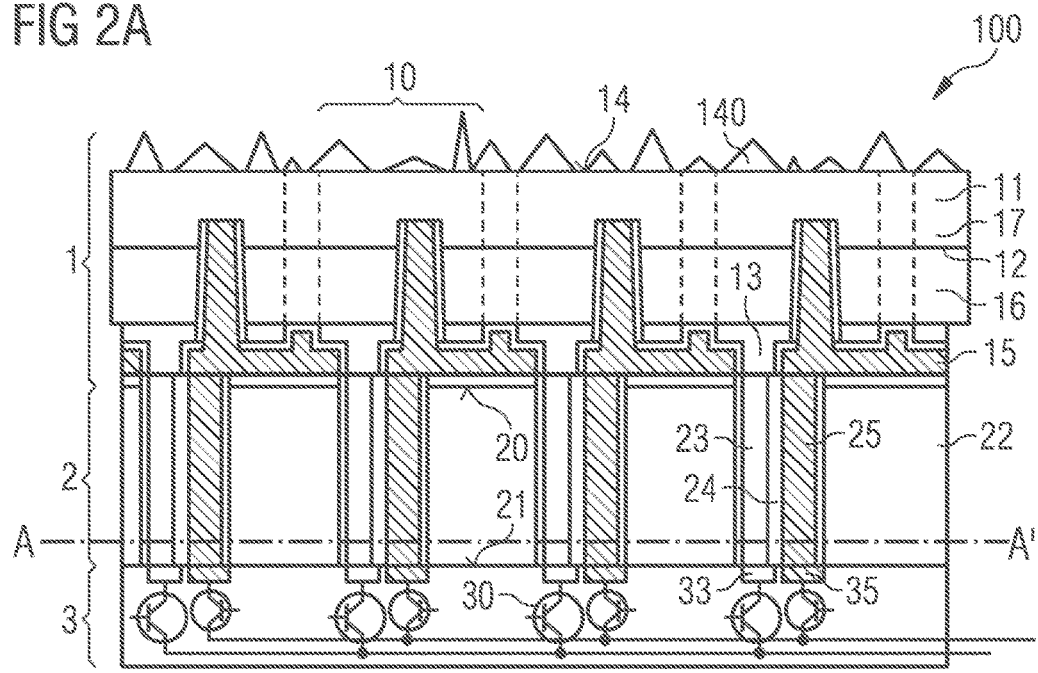

FIG. 1A shows an exemplary embodiment of an optoelectronic component 100 in a lateral cross-sectional view. The component 100 includes a semiconductor chip 1 mounted on to a carrier 3 via a metallic connecting element 2. The connecting element 2 is in direct contact with the semiconductor chip 1 and the carrier 3.

The semiconductor chip 1 comprises a semiconductor layer sequence 11 between a mounting side 18 and a radiation exit surface 14 opposite thereto. In the present case, the semiconductor layer sequence 11 includes a first layer 16 and a second layer 17. The first layer 16 is, e.g., a p-conducting layer and the second layer 17 is, e.g., an n-conducting layer. However, reverse dopings are possible as well. An active layer 12, for example, in the form of a p-n junction, is arranged between the first layer 16 and the second layer 17. In this case, the semiconductor layer sequence 11 is AlInGaN-based, for example. The active layer 12 can emit electromagnetic radiation in the ultraviolet or blue spectral range during the intended operation.

It can also be taken from FIG. 1A that a remainder of a growth substrate 140 is present on the radiation exit surface 14 of the semiconductor chip 1, which faces away from the connecting element 2, and forms a structuring on the radiation exit surface 14. This structuring may serve as an optical decoupling structure for the increase of efficiency. Alternatively, the growth substrate 140 can be removed completely and the second layer 17 can be patterned by means of an etching process. The growth substrate 140 can also be patterned even before growing the semiconductor layer sequence 11 thereon, so that this structuring is transferred on to the semiconductor layer sequence 11 or the second layer 17 during the growth process and also remains in the semiconductor layer sequence 11 or the second layer 17 even after detaching the growth substrate 140.

In the lateral direction, the semiconductor chip 1 is sub-divided into multiple neighboring pixels 10. Each pixel 10 can be activated individually and independently from the other, so that the radiation exit surface 14 of the semiconductor chip 1 forms a pixelated display, for example. Each pixel 10 therefore corresponds to one pixel of the display.

It can also be taken from FIG. 1A that the semiconductor chip 1 comprises a wiring structure in the form of contact elements 13, 15. First contact elements 13 contact the first layer 16, second contact elements 15 serve for contacting the second layer 17. The second components 15 are guided through the first layer 16 and the active layer 12 and open into the second layer 17. Both contact elements 13, 15 can be externally electrically contacted in the unmounted state of the semiconductor chip 1 from the mounting side 18.

The first contact elements 13 are electrically insulated from the second contact elements 15 by means of insulating layers. Furthermore, the lateral extensions of the first contact elements 13 determine the lateral dimensions of one pixel 10.

In the present case, the mounting side 18 of the semiconductor chip 1 is made of a solid semiconductor material or a metal along the entire lateral extent.

The metallic connecting element 2 is applied directly on to the mounting side 18 of the semiconductor chip 1. The connecting element 2 includes a metallic connecting layer 22 passed-through by first metallic through-connections 23. An upper side 20 of the connecting element 2 is in direct contact with the semiconductor chips 1, an underside 21 of the connecting element 2 and opposite the upper side 20 is in direct contact with the carrier 3. In this case, the upper side 20 and the underside 21 are at least partially formed by the connecting layer 22.

In the lateral direction, the first through-connections 23 are arranged in such a way as to overlap with the first contact elements 13 of the semiconductor chip 1 and to be in direct mechanical contact with the first contact elements 13. Here, each first contact element 13 has a first through-connection 23 clearly assigned to it. Furthermore, the first contact elements 13 and the second contact elements 23 do not form a unit, rather an interface is formed between the first contact elements 13 and the first through-connections 13. The first contact elements 13 and the first through-connections 23 are not formed in one piece in the direction perpendicular to the lateral direction.

Furthermore, the first through-connections 23 are electrically insulated and spaced from the connecting layer 22 by means of insulating regions 24. The insulating regions 24 can be hollow spaces filled with gas, for example.

It can also be taken from FIG. 1A that the connecting layer 22 is not in direct mechanical contact with the semiconductor chip 1. Rather, the semiconductor chip 1 and the connecting layer 22 are insulated by an insulating layer 19 located on the mounting side 18 of the semiconductor chip 1. In this case, the metal connecting layer 22 does not form a contact for the semiconductor chip 1, but merely serves as a cooling element and as a mechanically-supporting element, for example.

Moreover, the insulating layer 22 has a second metallic through-connection 25 formed therein on the edge of the component 100, this second connection also separated from the connecting layer 22 by means of an insulating region 24. In contrast to the first through-connections 23, the second through-connection 25 is not completely surrounded laterally by the connecting layer 22. The second through-connection 25 is in direct mechanical and electrical contact with the second contact element 15 of the semiconductor chip 1, such that the second contact elements 15 or the first layer 16 of the semiconductor layer sequence 11 can be electrically contacted via the second through-connection 25. The first through-connections 24 in each case form a first contact to the pixels 10, the second through-connection 25 forms a respective common counter-contact for all pixels 10.

The carrier 3 is arranged on the underside 21 of the connecting element 2, this carrier preferably formed as an active matrix element with a plurality of switches 30. Each switch 30 is connected to a first through-connection 23 via a first contact element 33 of the active matrix material and is therefore assigned to one pixel 10. The second through-connection 25 is electrically-conductively connected to a second contact element 25 of the active matrix element 3. The switches 40 are field effect transistors, for example. Each pixel 10 can be activated individually and independently from one another via the switches 30.

FIG. 1B shows a top view of the connecting element 2 for a section along the plane AA' of FIG. 1A. It can be discerned here that each pixel 10 indicated by the dashed rectangles, has a first through-connection 23 assigned to it which is completely enclosed by the insulating region 24 and the connecting layer 22 on all sides. The second through-connections 25 are arranged on the edge of the component 100, these connections as well surrounded by the insulating region 24. In the present case, the through-connections 24 are electrically insulated from one another, whereas the second through-connections 25 are electrically-conductively connected to one another via the second contact elements 15.

The first through-connections 23 have circular or elliptic cross-sectional areas in FIG. 1B. The cross-sectional areas of the second through-connections 25 are composed of semi-circles and rectangles. The above-mentioned FIG. 1A shows a sectional view through the component 100 along the dashed plane BB' of FIG. 1B.

The exemplary embodiment of FIG. 1C shows a top view similar to that of FIG. 1B. However, the second through-connections 25 are formed with triangular cross-sectional areas in a top view.

In the exemplary embodiment of FIG. 1D, the component 100 has only one single further through-connection 25 that extends along a lateral surface of the component 100. The second through-connection 25 has sawtooth-shaped recesses in a top view.

In the exemplary embodiment of FIG. 1E, the second through-connection 25, in contrast to the exemplary embodiment of FIG. 1D, has wave-like recesses.

In contrast to FIG. 1A, the exemplary embodiment of FIG. 2A not only shows a second through-connection 25, rather each first through-connection 23 has a second through-connection 25 arranged next to it. The first through-connection 23 and the second through-connections 25 are arranged in a common hole through the connecting layer 22. In other words, the first through-connection 23 and the second through-connection 25 are not separated from each other by the connecting layer 22, but by the insulating region 24. On the carrier 3, each first through-connection 23 and each second through-connection 25 has a distinct switch 30, so that the pixels 10 can be supplied with power individually and independently one from the other via the first through-connections 23 and the second through-connections 25.

Figure 2B:
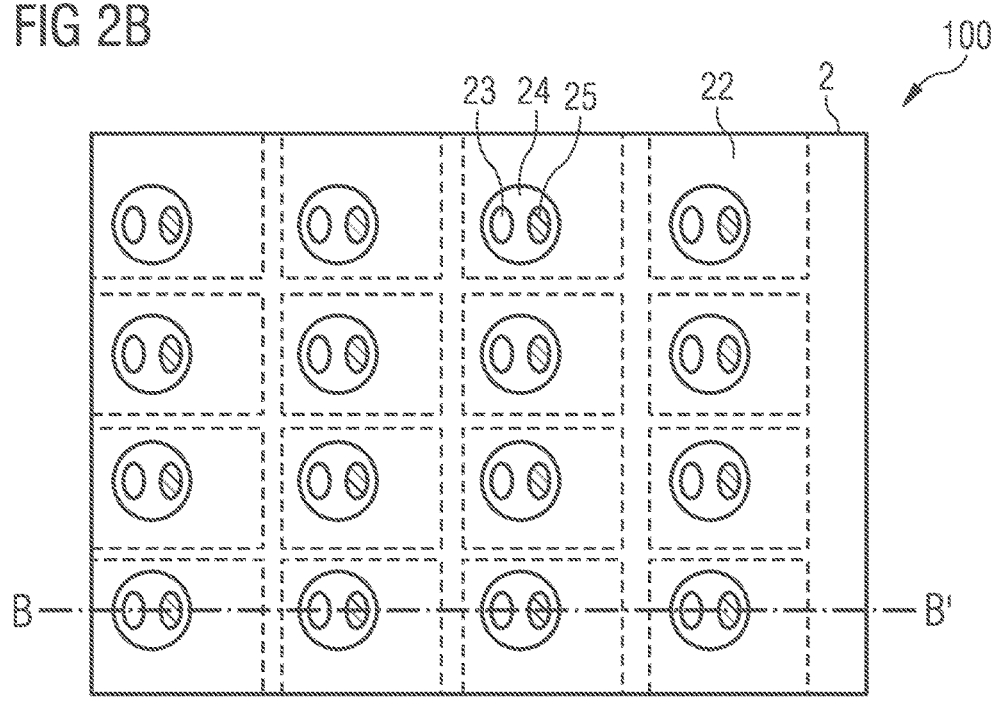

It can be discerned in the top view of FIG. 2B that each hole within the connecting layer 22 has a first through-connection 23 and a second through-connection 25, which are separated amongst each other by the insulating region 24. In the present case, the holes within the connecting layer 22 are of circular design, the first through-connections 23 and the second through-connections 25 are each of elliptic design.

Figure 3A:
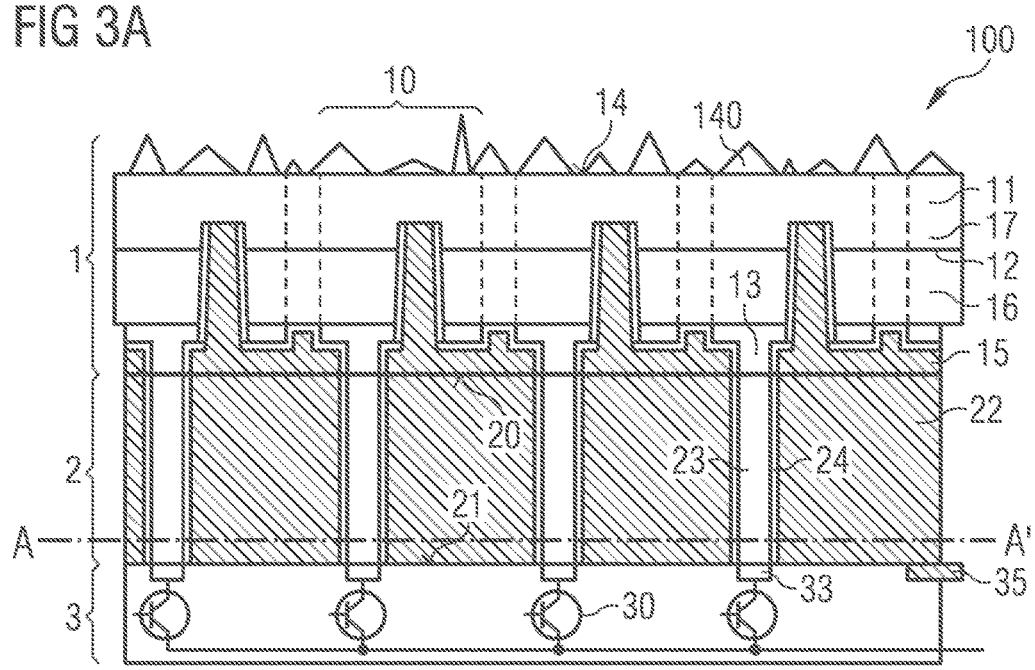

The exemplary embodiment of FIG. 3 shows an optoelectronic component 100, which, in contrast to the preceding exemplary embodiments, has the connecting layer 22 not electrically-insulated from the semiconductor chip 1, but connected thereto in an electrically-conductive manner. The connecting layer 22 forms a common counter-contact for all pixels 10 to the first contacts formed by the first through-connections 23. The connecting layer 22 is in electric contact with the carrier 3 via the second contact element 35. In the present case, contacting of the second layer 17 of the semiconductor layer sequence 1 therefore takes place via the connecting layer 22.

Figure 3B:
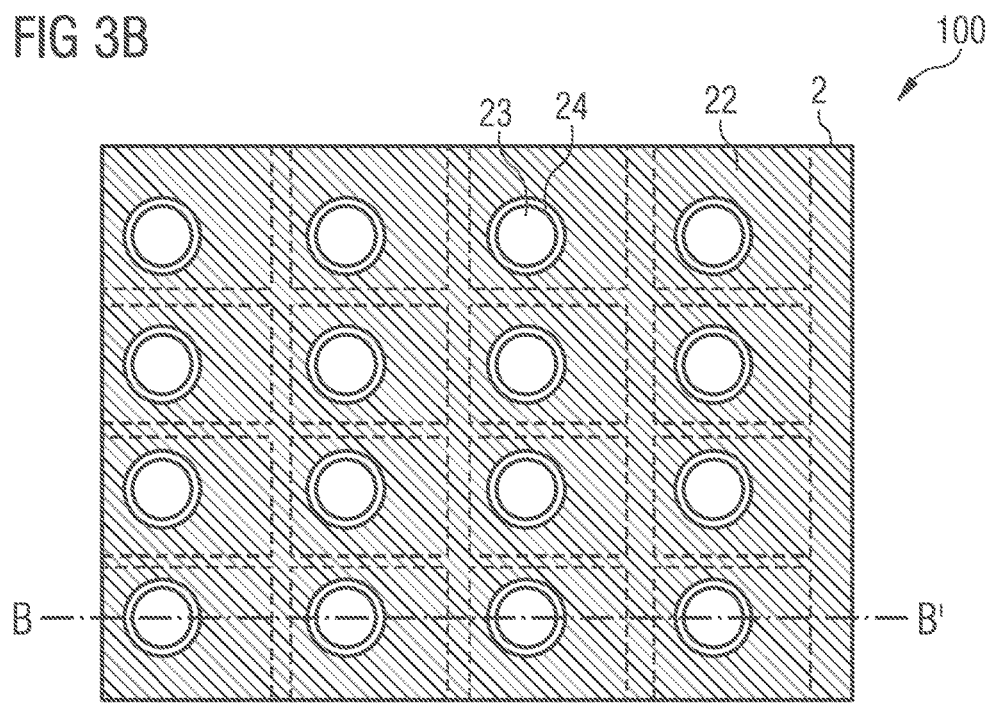

FIG. 3B, in turn, shows a top view of the connecting element 2 along the sectional plane AA'.

FIG. 4A shows a first position in a method for producing an exemplary embodiment of an optoelectronic component 100. A carrier 3 as described above and a semiconductor chip 1 is provided. The semiconductor chip 1 differs from the above-described semiconductor chip 1 merely in that it presents a growth substrate 140 stabilizing the semiconductor chip 1 and grown on to the semiconductor layer sequence 11, in which the semiconductor chip 1 is present.

FIG. 4A also shows how a patterned metal layer is applied on to the mounting side 18 of the semiconductor chip 1. The patterned metal layer is formed of a connecting layer 22, first through-connections 23 and insulating regions 24.

The connecting layer 22 and the first through-connections 23 are made of a solder material, the insulating regions 24 are made of a solid material such as glass or a plastic material or a photoresist, so that the patterned metal layer shown in FIG. 4a is mechanically self-supporting. The patterned metal layer can then be glued or soldered on to the semiconductor chip 1. Attaching the patterned metal layer can also be effected in a galvanic manner, for example. In this case, the insulating regions 24 can be gas-filled hollow spaces.

Figure 4B:
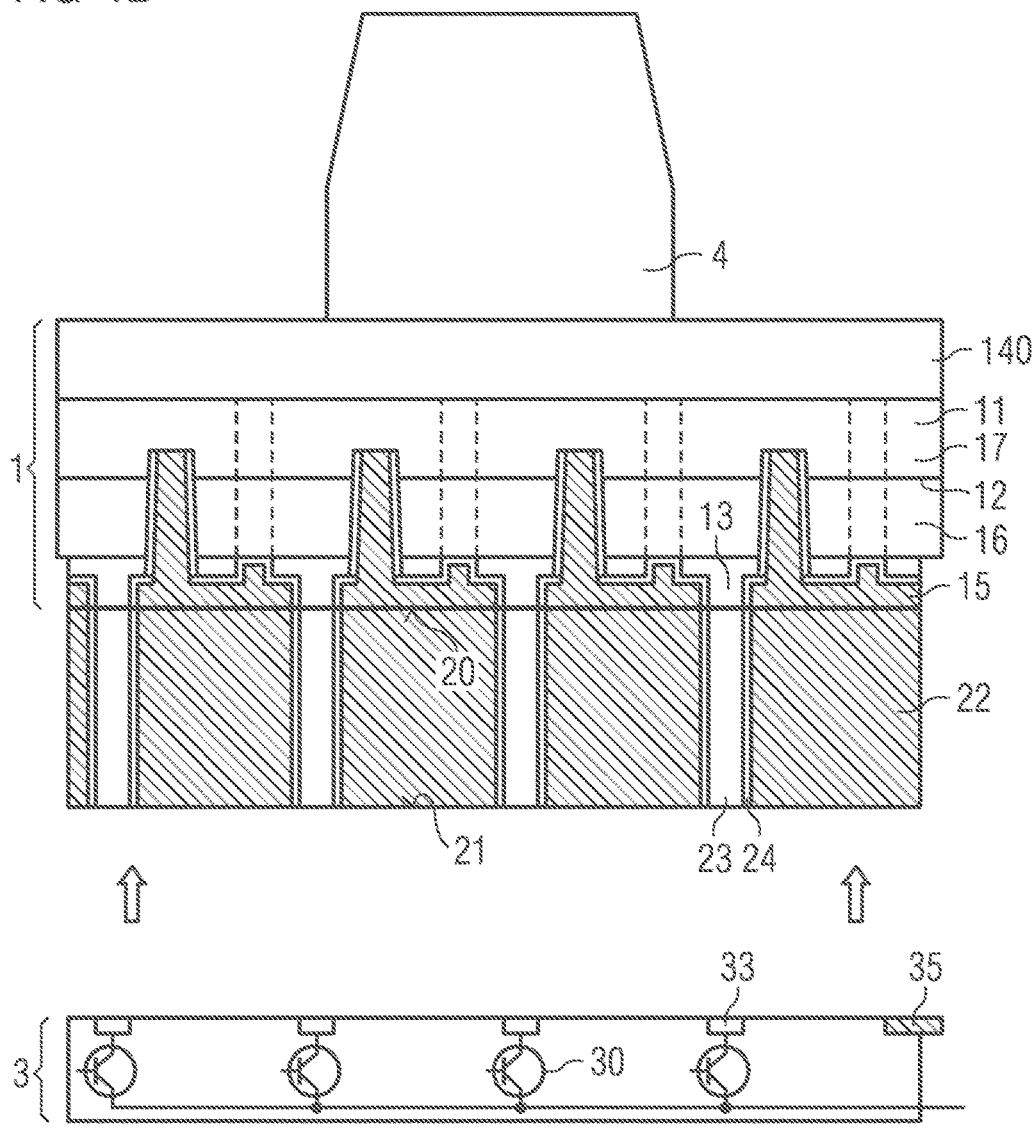

FIG. 4B shows another method step, in which the semiconductor chip 1 having the patterned metal layer applied thereon is attached on to the carrier 2 by means of a gripping tool 4, in such a way that the carrier 3 and the patterned metal layer are made to directly contact each other.

After application of the semiconductor chip 1 on to the carrier 3, as shown in FIG. 4C, a friction welding process can be used, in which the patterned metal layer is temporarily connected to the carrier 3.

Figure 4D:
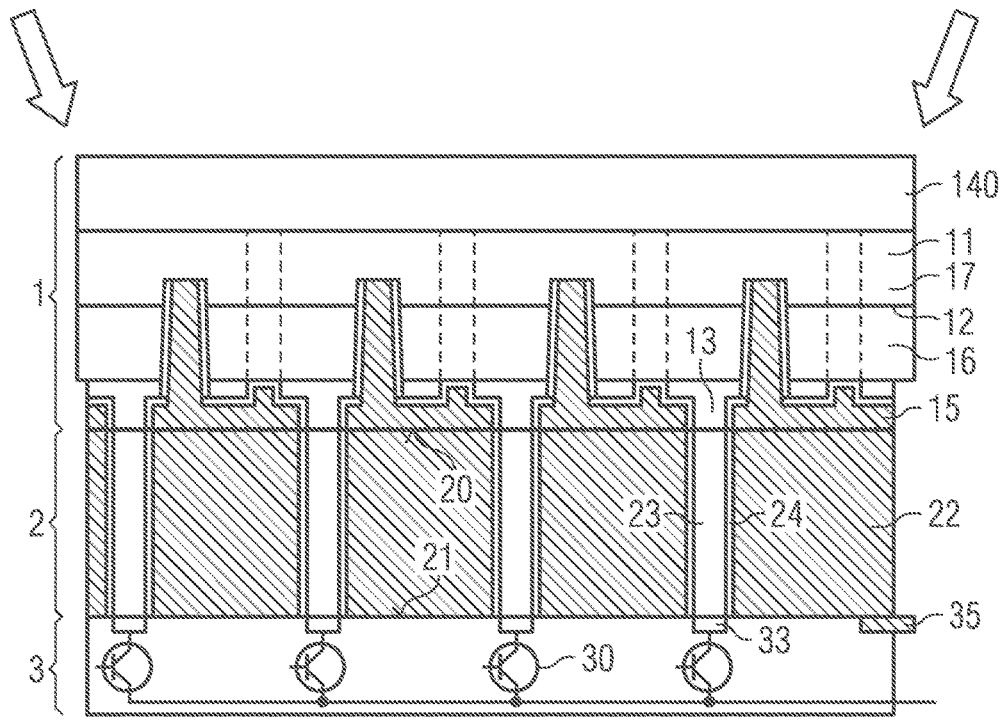

As shown in FIG. 4D, after the temporary connection, the patterned metal layer is at least partially fused by means of the friction welding method, thereby forming a permanent mechanical connection between the semiconductor chip 1 and the carrier 3 in the form of a connecting element 2.

Figure 4E:
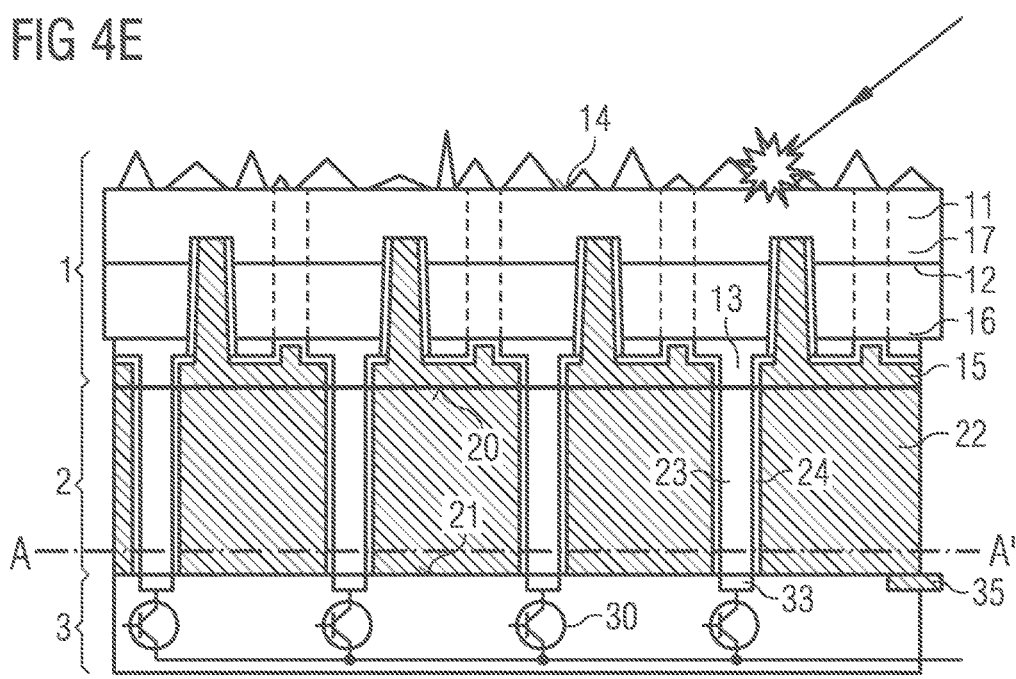

FIG. 4E further shows another method step, in which the growth substrate 140 is at least partially removed from the semiconductor chip 1 after the permanent connection of the carrier 3 and the semiconductor chip 1, for example, by means of a laser lift-off process, so that a patterned radiation exit surface 14 is formed.

Furthermore, some specific exemplary embodiments are provided for the production method, in particular for the method illustrated in conjunction with FIG. 4. The numerical values and/or parameters must not exactly be observed in order to perform the method. They can also be selected with deviations of +/−20%, for example. Method steps A) to C) take place in the wafer composite, for example. In other words, the semiconductor chips 1 and/or the carrier 3 can form part of a wafer having a plurality of semiconductor chips 1 and/or carriers 3. After application of the patterned metal layer, the wafers can be singulized into individual semiconductor chips 1 and/or carriers 3. Connecting the semiconductor chip 1 with the assigned carrier 3 in step D) can be done as a so-called chip-to-wafer process or wafer-to-wafer process.

In the first exemplary embodiment, the semiconductor chip 1 is an AlGanInN-based pixelated chip, with the growth substrate 140 based on sapphire. The lateral dimensions of the semiconductor chip 1 are 1.6 mm×1.7 mm, and the number of pixels amounts to 256. Both the connecting layer 22 and the first through-connections 23 comprise a gold base and a AuSn solder layer with at least 50 at.-% Sn. The carrier 3 comprises a Ni/Pd/Au surface with a thickness of the Au layer of approximately 20 nm.

During the attachment of the semiconductor chip 1 having the patterned metal layer arranged thereon on to the carrier 3, an ultrasonic friction welding process is used, with an ultrasound power of 0.4 W and a pressing force of 1.2 N, thereby temporarily fixing the semiconductor chip 1 on to the carrier 3. In this example, a Si wafer of 300 nm diameter is used, this wafer including a plurality of the future carriers 3. This Si wafer is equipped with approximately 20,000 of the indicated semiconductor chips 1.

After the friction welding process, the outer AuSn layer is made to melt at 305° C. in a vacuum bracing furnace, in that in an eutectic reaction, the AuSn layer with the Au base becomes liquid at 280° C. Due to the surface-minimization of the liquid solder material, a fine adjustment of the semiconductor chip 1 is effected on the carrier 3. The liquid solder material wets the Ni/Pd/Au-layer, with the gold dissolving and tin from the solder material forming an intermetallic bond with the palladium layer. The self-centering or self-adjustment by minimization of the surface of the liquid metal refines the adjustment. Cooling down to below 280° C. fixes the semiconductor chips 1 on to the Si wafer.

After that, the semiconductor chips 1 rest directly on the upper side 20 of the connecting element 2 in a support region, with the support region providing direct contact between a solid material of the semiconductor chip 1 and a solid material of the created connecting element 2. In this case, only the insulating regions 24 do not form part of the support region.

The connecting element 2, in particular the connecting layer 22, serves as a cooling plate for the semiconductor chips 1. A subsequent laser lift-off step removes the growth substrate 140. Without the growth substrate 140, which could possibly act as a light-scattering plate, the pixelated semiconductor chip 1 obtains the contrast between neighboring pixels 10 which is beneficial for practical applications.

In the second embodiment, a pixelated semiconductor chip 1 with a surface area of approximately 2 mm×2.2 mm and a number of 512 pixels 10, which can be activated individually, is provided. The first through-connections 23 and the second through-connections 25 comprise an Au base having an AuSn solder layer with an Sn content of 50 at.-%. The connecting layer 22 is also formed with this multilayer structure. The individual pixels 10 can be activated independently from one another by means of the first through-connections 23. The second through-connections 25 form a common counter-contact to the first through-connections 23.

The carrier 3 comprises an Ni/Pd/Au surface having approximately 20 nm of Au. The semiconductor chip 1 is temporarily fixed to the carrier 3 by means of ultrasound friction welding at 4.7 W and a pressing force of 3.9 N. In this example, a Si wafer with a diameter of 300 nm and including a plurality of the future carriers 3 is equipped with approximately 15,000 semiconductor chips 1. After friction welding, the AuSn layer is caused to melt at a temperature of 305° C. in a vacuum bracing furnace. The liquid solder wets the Ni/Pd/Au layer, with the aluminium dissolving and Sn from the solder forming an intermetallic bond with the palladium layer. The melt reacts with the Au base at the same time, leading to the intended constitutional undercooling. The compound therefore solidifies even before the cooling step.

In the third exemplary embodiment, a Cr/Ni/Sn/Ti/Au layer sequence is used for the first through-connections 23 and/or the second through-connections 25 and/or the connecting layer 22 instead of the Au/AuSn layer sequence. The Ti layer acts as a temporary barrier. An asymmetric distribution of the constituents is used. The carrier 3 is coated with a Ni/Au layer, with the Au layer having a thickness of approximately 200 nm. The semiconductor chip 1 is temporarily fixed on to the carrier 3 by means of ultrasound welding with an ultrasound power of 1.7 W and a pressing force of 8.5 N. Here, a Si wafer with a diameter of approx. 200 mm is used, this wafer comprising a plurality of the future carriers 3. The Si wafer is equipped with approx. 9,000 semiconductor chips 1. The Sn layer is caused to melt in a vacuum bracing furnace at 260° C. The liquid solder wets the Au layer, with the Au layer dissolving and tin from the solder forming an intermetallic bond with both Ni layers, which leads to the intended, constitutional undercooling.

In a fourth exemplary embodiment, the solder material is formed by a Ti/Pt/Sn/In layer system. Just as well, the asymmetric distribution of the constituents is used. The carrier 3 is coated with a Ti/Pt/Au layer, with the Au layer having a thickness of approx. 3 μm. In the ultrasound welding, the semiconductor chip 1 is mounted on to the carrier 3 using ultrasound welding with an ultrasound power of 12 W and a pressing force of 4.2 N. A Si waver with a diameter of 200 mm and comprising a plurality of the future carriers 3 is used. This Si wafer is equipped with approximately 9,000 semiconductor chips 1. The In/Sn layer is caused to melt at 120° C. in a vacuum bracing furnace after the ultrasound welding. The liquid solder wets the Au layer and, due to the surface minimization of the liquid metal, a fine centering of the semiconductor chips 1 on the carriers 3 occurs. The permanent fixation of the semiconductor chips 1 on to the carriers 3 is caused by intermetallic bond formation.

In a fifth exemplary embodiment, a Ti/Pt/Sn/Ti/Au layer sequence is used as a solder material. In this case, the Ti layer acts as a temporary barrier. Here, an asymmetric distribution of the constituents is used as well. The carrier 3 is coated with a Ni/Au layer, with the Au layer having a minimum thickness of 3 μm. The semiconductor chip 1 is temporarily fixed on to the carrier 3 via thermal compression at 200° C. and a pressing force of 27 N. In this example, an Si wafer of 200 mm diameter is used, this wafer including a plurality of the future carriers 3. The Si wafer has more than 9,000 semiconductor chips 1 applied thereon in one single step. Thereafter, the Sn layer is caused to melt at 260° C. in a vacuum furnace. The liquid solder wets the Au layer. Permanent fixing of the semiconductor chips 1 on to the carriers 3 is caused by intermetallic bond formation as isothermal solidification. In this case, the insulating region 24 between the first through-connections 23 and the connecting layer 22 has a width of 6 μm, for example.

In a sixth embodiment, a pixelated semiconductor chip 1 having a surface area of approximately 4 mm×4.2 mm and with a number of 1,024 pixels 10 is provided. The semiconductor chip 1 comprises a common cathode (second through-connections 25) and individual anodes (first through-connections 23) for each pixel 10. The mechanical and thermal coupling is affected by means of the connecting layer 22, which, other than in the above exemplary embodiments, is first applied on to the carrier 3 here. Both the common cathode and the individually-addressable anodes are formed into the connecting layer 22 as second through-connections 25 or first through-connections 23. In this case, the connecting layer 22 provides the collector potential for the carrier 3 formed as an active matrix element.

The connecting layer 22 and/or the first through-connections 23 and/or the second through-connections 25 comprise a Ti/Ni/Sn/Ti/Au layer sequence here. The second Ti layer acts as a temporary barrier. In this case, an asymmetric distribution of the constituents is used as well. The semiconductor chips 1 are coated with an Ni/Au layer, with the Au layer having a thickness of approx. 0.1 μm. The semiconductor chip 1 is temporarily fixed to the carrier 3 by means of thermal compression at 180° C. In this example, a semiconductor chip 1 is placed on to an individual carrier 3. The Sn layer is subsequently caused to melt in a vacuum furnace at 590 K. The liquid Sn wets the Au layer, centers the semiconductor chip 1 on the active matrix element 3 and reacts with Ni to form an intermetallic bond of the formula $Ni_3Sn_4$. This intermetallic bond formation leads to the microstructures permanent fixation of the placing parameters as an isothermal solidification. The insulating region may have a width or a thickness of, e.g., 7 μm in this case.

FIGS. 5A and 5B show a production method as an alternative to FIG. 4. FIG. 5 shows a position of the production method, in which a semiconductor chip 1 as described above and having a patterned metal layer is provided. The carrier 3 also has a patterned metal layer applied thereon. The sides of the patterned metal layers facing away from the semiconductor chip 1 or the carrier 3 are planarized by means of a chemo-mechanical process. After that, the semiconductor chip 1 having the patterned metal layer is applied on to the patterned metal layer of the carrier 3, thereby affecting a wafer-bonding, or an optical contact bonding. This results in the formation of a connecting element 2, effecting a permanent connection between the semiconductor chip 1 and the carrier 3. The connecting element 3 has, e.g., an interface with increased defect density in the region where the two patterned metal layers are placed one on top of the other.

The production method, in particular the method of FIG. 5, is explained in greater detail in the following by means of three specific exemplary embodiments. Here, in turn, the numeric values and/or parameters indicated below must not exactly be observed for performing the method, but can be selected with deviations of +/−20%, for example.

In the first embodiment, the patterned metal layers applied on to the carrier 3 and the semiconductor chip 1 are formed of Cu and comprise chemo-mechanically planarized surfaces. The semiconductor chip 1 and the carrier 3 are adjusted one on top of the other in a wafer assembly. The planarized surfaces cause the optical contact bonding when brought into contact. Metallic bonds form between the patterned metal layers upon subsequent relocation at mild temperatures, e.g., 500 K for 90 minutes, for example. A possibly formed surface oxide on the two patterned metal layers is distributed thereby in such a way that no oxide layers obstructing the transport of current or heat remain at the interface between the two patterned metal layers.

In the second embodiment, in turn, the carrier 3 and the semiconductor chip 1 are in each case applied with a patterned metal layer having a chemo-mechanically-planarized surface. The semiconductor chip 1 and the carrier 3 are adjusted one on top of the other in a wafer composite. When brought into contact, the planarized surfaces cause a contact bonding with intermetallic bonds forming automatically. The individual semiconductor chip 1 has a size of approx. 2.1 mm×6 mm and comprises approx. 3,064 pixels.

In contrast to the illustration of FIG. 5, the connecting layer 22 is electrically insulated from the semiconductor chip 1. Thirty-six second through-connections 25 are used as the common cathode of the semiconductor chip 1 and serve as n-contacts. These are arranged on the edge of the connecting layer 22 and are not completely surrounded by the connecting layer 22. The p-type contacts, in the present case, i.e., the first through-connections 23, have a diameter of approx. 25 μm, the insulating regions 24 around the first through-connections 23 have a width of approx. 30 μm. In total, the cut-out within the connecting layer 22 has a width of approx. 80 μm for each first through-connection 23.

The second through-connections 25 are placed on the edge of the connecting element 2 as a combination of semi-circles having a semicircular diameter of 18 μm and rectangles with side lengths of 18 μm. Circumferentially, the second through-connections 25 are completely surrounded by an insulation region 24 having a width of approx. 15 μm.

The third embodiment provides a pixelated semiconductor chip 1 based on AlGaInN which comprises a sapphire growth substrate 140. Both the carrier 3 and the semiconductor chip 1 each have a patterned metal layer of gold applied thereon. After the chemo-mechanical planarization and the removal of all surface adsorbates, the semiconductor chip 1 and the carrier 3 are each adjusted one on top of the other in a wafer composite. Due to a contacting, the planarized surfaces cause a contact bonding and metallic bonds are formed automatically. Here, the individual semiconductor chip has a size of approx. 2 mm×6 mm.

In contrast to the illustration of FIG. 5, the connecting layer 22 is electrically insulated from the semiconductor chip 1. Each of the 3,064 pixels 10 of the first semiconductor chip 1 is individually connected to a p-contact (first through-connection 23) and an n-contact (second though-connection 25). To that end, a circular hole of 80 μm diameter is assigned to each pixel 10 within the connecting layer 22. Each hole has a first through-connection 23 and a second through-connection 25 arranged therein. The first and second through-connections 23, 25 each have an elliptic cross-sectional shape with semi-axes of 12.5 μm and 25 μm, respectively.

The invention is not limited to the exemplary embodiments by the description using these exemplary embodiments. The invention rather comprises any new feature as well as any combination of features, particularly including any combination of features in the claims, even if this feature or this combination is per se not explicitly specified in the claims or in the exemplary embodiments.

The invention claimed is:

1. An optoelectronic component comprising:
a semiconductor chip subdivided into a plurality of pixels, the pixels being arranged next to one another in a lateral direction and being configured to be activated individually and independently;
a metallic connecting element having an upper side and an underside, the connecting element including a contiguous metallic connecting layer, the connecting layer being completely passed through by a plurality of first metallic through-connections arranged next to one another in the lateral direction and the first through-connections are electrically insulated and spaced from the connecting layer by insulating regions; and
a carrier located directly at the underside of the connecting element in an electrically-conductive and mechanically-stable manner,
wherein a support region of the semiconductor chip is in direct contact with the upper side of the connecting element and is connected to it in a mechanically stable manner,
wherein the connecting layer terminates flush with the upper side and the underside in a direction perpendicular to the lateral direction,
wherein each first through-connection is unambiguously assigned and electrically-conductively connected to one pixel forming a first electrical contact to the assigned pixel, and
wherein the semiconductor chip is connected by the connecting element to the carrier.

2. The optoelectronic component according to claim 1, wherein the carrier is an active matrix element, wherein the active matrix element includes a plurality of switches, wherein each switch is unambiguously assigned and electrically connected to one pixel via a first through-connection, and wherein the pixels are configured to be individually and independently activated by the switches.

3. The optoelectronic component according to claim 2, wherein a surface area of the support region is at least 7/12 of a surface area of a mounting side of the semiconductor chip facing the upper side, wherein the first through-connections are in direct electrical and mechanical contact with first contact elements of the active matrix element, and/or to first contact elements of the semiconductor chip, and wherein the first through-connections are not formed integrally with the first contact elements in the direction perpendicular to the lateral direction.

4. The optoelectronic component according to claim 1, wherein the semiconductor chip is a pixelated and/or segmented semiconductor chip.

5. The optoelectronic component according to claim 1, wherein the first through-connections and/or the connecting layer are not formed integrally in the direction perpendicular to the lateral direction, and wherein the connecting layer and/or the first through-connections, in the direction perpendicular to the lateral direction, in each case comprises a multilayer structure made of a plurality, superimposed, different, individual metallic layers.

6. The optoelectronic component according to claim 1, wherein the first through-connections and/or the connecting layer comprise one or more of the following alloys and/or one or more of the following layer structures: $Au_xSn_y$, $Cr/Ni_xSn_yTi_zAu_w$, $Ti/Pt_ySn_zIn_x$, $Ti/PtSn_yTi_zAu_w$.

7. The optoelectronic component according to claim 1, wherein the first through-connections and/or the connecting layer comprise at least two individual layers arranged one above the other in a vertical direction, between which an interface is formed, wherein the at least two individual layers are connected to one another at the interface by wafer bonding, and wherein the individual layers comprise Cu and/or Au and/or Ni and/or Ag.

8. The optoelectronic component according to claim 1, wherein the first through-connections and/or the connecting layer are porous with a proportion of pores of at least 10 vol. %.

9. The optoelectronic component according to claim 1, wherein the insulating regions are cavities filled with gas, and wherein the connecting element comprises at least 60 vol. % of metal.

10. The optoelectronic component according to claim 1, wherein the connecting layer is electrically-conductively connected to the semiconductor chip and forms a common counter-contact to the first contacts for all pixels, and wherein, during operation, electrons and holes are injected into the semiconductor chip via the first contacts and via the counter-contact.

11. The optoelectronic component according to claim 1, wherein the connecting layer is electrically insulated from the semiconductor chip and does not form an electric contact to the semiconductor chip, wherein the connecting layer further comprises second metallic through-connections, and wherein the second metallic through-connections form a counter-contact to the first contacts.

12. The optoelectronic component according to claim 11, further comprising second through-connections, wherein each second through-connection is unambiguously assigned and electrically-conductively connected to one pixel forming a counter-contact to the first contact, and wherein the first and second through-connections associated with the assigned pixel are arranged in a common hole through the connecting layer and are not separated from one another by the connecting layer.

13. The optoelectronic component according to claim 1, wherein the connecting element has a thickness between 0.5 µm and 50 µm inclusive, wherein the first through-connections have a lateral extension between 2 µm and 80 µm inclusive, wherein a distance between the connecting layer and the first through-connections is between 0.5 µm and 50 µm inclusive, and wherein the first through-connections in a plan view of the upper side have elliptic or round cross-sectional areas.

14. The optoelectronic component according to claim 1, wherein the semiconductor chip comprises a semiconductor layer sequence with an active layer configured to generator or absorb radiation, wherein the semiconductor chip is free of a growth substrate for the semiconductor layer sequence, wherein the semiconductor chip is not mechanically self-supporting, and wherein contact elements for electrically contacting the semiconductor chip are arranged on a mounting side of the semiconductor chip facing the upper side.

15. The optoelectronic component according to claim 1, wherein the active layer extends contiguously along the entire lateral extension of the semiconductor chip.

16. The optoelectronic component according to claim 14, wherein the semiconductor layer sequence includes at least an n-conducting or a p-conducting semiconductor layer, which extends contiguously along the entire lateral extension of the semiconductor chip.

17. An optoelectronic component comprising:
a semiconductor chip subdivided into a plurality of pixels that are arranged next to one another in a lateral direction and that are configured to be activated individually and independently;
a metallic connecting element having an upper side and an underside; and
a carrier located directly at the underside of the connecting element in an electrically-conductive and mechanically-stable manner,
wherein a support region of the semiconductor chip is in direct contact with the upper side of the connecting element and is connected to it in a mechanically stable manner,
wherein a surface area of the support region is at least 7/12 of a surface area of a mounting side of the semiconductor chip facing the upper side,
wherein the connecting element has a thickness between 0.5 µm and 50 µm inclusive,
wherein the connecting element includes a contiguous metallic connecting layer, which is completely passed through by a plurality of first metallic through-connections arranged next to one another in the lateral direction,
wherein the connecting layer terminates flush with the upper side and the underside in a direction perpendicular to the lateral direction,
wherein the first through-connections are electrically insulated and spaced from the connecting layer by insulating regions,
wherein each first through-connection is unambiguously assigned and electrically-conductively connected to one pixel forming a first electrical contact to the assigned pixel, and
wherein the semiconductor chip is connected by the connecting element to the carrier.

* * * * *

UNITED STATES PATENT AND TRADEMARK OFFICE
CERTIFICATE OF CORRECTION

PATENT NO. : 10,475,778 B2  
APPLICATION NO. : 15/578240  
DATED : November 12, 2019  
INVENTOR(S) : Pfeuffer et al.

Page 1 of 1

It is certified that error appears in the above-identified patent and that said Letters Patent is hereby corrected as shown below:

In the Claims

In Column 18, Lines 2-3, Claim 6, delete "$Au_xSn_y$, $Cr/Ni_xSn_yTi_zAu_w$, $Ti/Pt_ySn_zIn_x$, $Ti/PtSn_yTi_zAu_w$" and insert --$Au_xSn_y$, $Cr/Ni_xSn_yTi_zAu_w$, $Ti/Pt_ySn_zIn_x$, $Ti/Pt_xSn_yTi_zAu_w$--.

In Column 18, Line 62, Claim 15, delete "claim 1" and insert --claim 14--.

Signed and Sealed this  
Twenty-eighth Day of July, 2020

Andrei Iancu  
*Director of the United States Patent and Trademark Office*